US006225804B1

(12) United States Patent
Lai (10) Patent No.: US 6,225,804 B1
(45) Date of Patent: May 1, 2001

(54) CORRECTION OF DC OFFSET IN MAGNETIC RESONANCE IMAGING SIGNALS

(75) Inventor: Ching-Ming Lai, Wakefield, MA (US)

(73) Assignee: Analogic Corporation, Peabody, MA (US)

( * ) Notice: Subject to any disclaimer, the term of this patent is extended or adjusted under 35 U.S.C. 154(b) by 0 days.

(21) Appl. No.: 09/426,327

(22) Filed: Oct. 25, 1999

(51) Int. Cl.$^7$ ........................................... G01V 3/00
(52) U.S. Cl. ..................... 324/309; 324/318; 324/317; 600/410
(58) Field of Search ..................... 324/309, 303, 324/300, 307, 318; 600/410

(56) References Cited

U.S. PATENT DOCUMENTS

| | | | |
|---|---|---|---|
| 5,245,283 | * | 9/1993 | Provost et al. ........................ 324/309 |
| 6,043,590 | * | 4/2000 | Hinks et al. ........................... 324/309 |
| 6,043,656 | * | 3/2000 | Ma et al. .............................. 324/309 |

* cited by examiner

Primary Examiner—Christine Oda
Assistant Examiner—Brij B. Shrivastav
(74) Attorney, Agent, or Firm—McDermott, Will & Emery (57) ABSTRACT

In an apparatus and method for correction of DC offset in magnetic resonance imaging signals, a phase-alternated RF pulse sequence causes the resulting DC offset artifact to be positioned at the boundaries of the object image, rather than at its center. The resulting artifact may be corrected by pre-calculating the region of the image data affected by the DC offsets, and by using the estimated errors in the image data to correct the collected data prior to image reconstruction.

27 Claims, 6 Drawing Sheets

CORRECTION OF DC OFFSET IN MAGNETIC RESONANCE IMAGING SIGNALS

BACKGROUND OF THE INVENTION

In a conventional two-dimensional Magnetic Resonance Imaging (MRI) scan, a radio-frequency (RF) energy pulse is applied to excite the nuclear spins of the object undergoing scanning. If a slice of the object is selected for scanning, a magnetic field gradient is applied in the direction perpendicular to the slice in conjunction with the RF pulse. As a result, an MRI signal is emitted from the excited slice at the resonant radio frequencies. The magnetic field gradient can be applied in any direction. For simplicity and clarity, the following description assumes that a slice perpendicular to the z-axis is selected for scanning. Thus, to be consistent with the following description, the magnetic field gradient applied with the RF pulse is along the direction of the z-axis.

The emitted MRI signal, denoted as $s(k_x, k_y)$ with $k_y$ set at a constant, represents a one-dimensional spectrum of the slice in two-imensional frequency space, commonly referred to as "k-space". Prior to detection of the MRI signal, a magnetic filed gradient is applied along a transverse direction, or y-axis direction, in order to induce a shift in the phase of the MRI signal in the y-direction of k-space. Additionally, a second RF pulse is commonly applied to refocus the MRI signal, according to a process referred to as generating "echo" of the spins. A magnetic filed gradient along the third orthogonal dimension, or x-axis direction, is thus activated during collection of the MRI signal. The collected MRI signal therefore constitutes a one-dimensional spectrum of the slice along the x-direction, spaced from the x-axis by an amount proportional to the strength and duration of the magnetic field gradient in the y-direction, as shown in k-space by the solid line 100 of FIG. 1.

Figure 1:
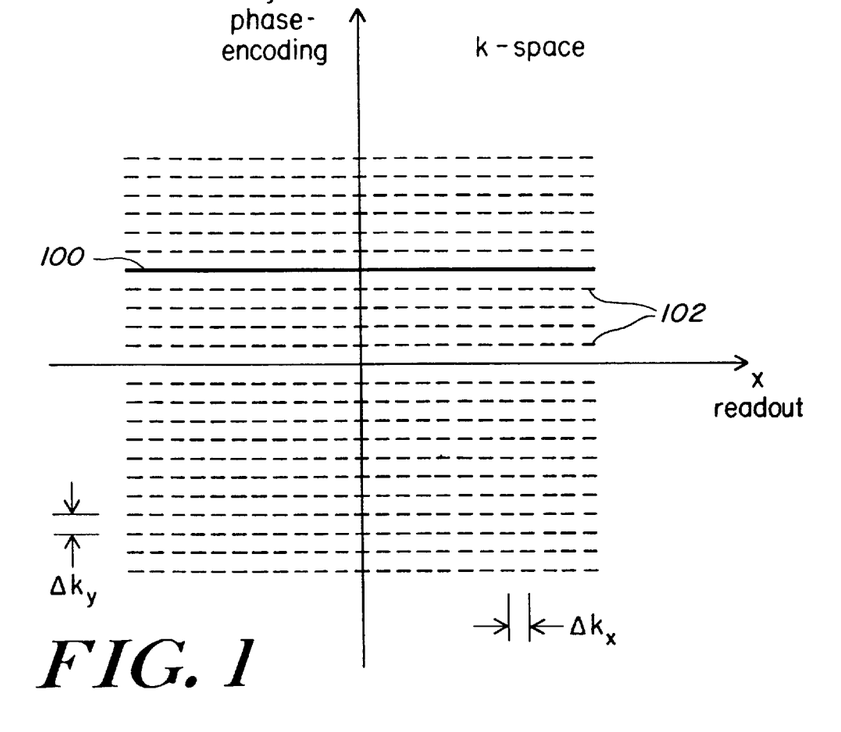
FIG. 1 is a plot of k-space including the x-axis (readout direction) and the y-axis (phase-encoding direction) and illustrating a plurality of phase-encoded MRI signals located along lines parallel to the readout direction.

During a scan sequence, the strength of the y-direction gradient is varied to generate a set of MRI signals having a range of phase shifts, which represent a set of one-dimensional spectra in the x-direction, spaced a plurality of predetermined distances from the x-axis center, as shown by the dashed lines 102 of FIG. 1. The x-direction of k-space is commonly referred to as the "readout" direction, and the y-direction is commonly referred to as the "phase-encoding" direction.

Suppose, for example, that each MRI signal is sampled at a constant interval $\Delta k_x$, along the x-direction in k-space, to provide $n_x$ complex data points. The strength of the y-direction gradient can be incrementally varied, at a constant increment, such that the collected signals are separated by a constant frequency interval $\Delta k_y$ along the y-direction in k-space. When a sufficient number, $n_y$, of MRI signals 100 are collected, the spectra are uniformly distributed. The spatial distribution of the resulting slice $f(x, y)$ can then be reconstructed using a two-dimensional Fourier transform of the k-space MRI signals. That is, $$f(x, y) = \sum_{k_y=-n_y\Delta k_y/2}^{n_y\Delta k_y/2-\Delta k_y} \sum_{k_x=-n_x\Delta k_x/2}^{n_x\Delta k_x/2-\Delta k_x} s(k_x, k_y)\exp\{-2\pi i(k_x x/n_x + k_y y/n_y)\}, \quad (1)$$

where $s(k_x, k_y)$ represents the collected MRI signals in k-space, and where $f(x,y)$ represents spatial image data in image-space as described above.

During this process, each collected MRI signal is initially applied to a Fourier transform in the first dimension along the readout direction (x-axis) to generate intermediate results $g(x, k_y)$ as:

$$g(x, k_y) = \sum_{k_x=-n_x\Delta k_x/2}^{n_x\Delta k_x/2-\Delta k_x} s(k_x, k_y)\exp\{-2\pi i(k_x x/n_x)\}. \quad (2)$$

The intermediate results $g(x, k_y)$ are then re-grouped and Fourier transformed in the second dimension along the phase-encoding direction (y-axis) to provide the spatial distribution function $f(x, y)$ of the object:

$$f(x, y) = \sum_{k_y=-n_y\Delta k_y/2}^{n_y\Delta k_y/2-\Delta k_y} g(x, k_y)\exp\{-2\pi i(k_y y/n_y)\} \quad (3)$$

where x and y represent discrete positions in the image plane at spatial intervals of $\Delta x$ and $\Delta y$, respectively:

$$x=-n_x\Delta x/2, -n_x\Delta x/2+\Delta x, \ldots, -\Delta x, 0, \Delta x, \ldots, n_x\Delta x/2-2\Delta x, n_x\Delta x/2-\Delta x \quad (4)$$

$$y=-n_y\Delta y/2, -n_y\Delta y/2+\Delta y, \ldots, -\Delta y, 0, \Delta y, \ldots, n_y\Delta y/2-2\Delta y, n_y\Delta y/2-\Delta y \quad (5)$$

In other words, the input data are Fourier transformed row-by-row, and then column-by-column, in k-space, to obtain the spatial data $f(x, y)$. The object image $p(x, y)$, is computed as the magnitude of the complex spatial function $f(x, y)$:

$$p(x, y)=\text{sqrt}\{f(x, y)f^*(x, y)\} \quad (6)$$

where $f^*(x, y)$ is the complex conjugate of $f(x, y)$, and "sqrt" represents the square-root function. It should be noted that the MRJ signals $s(k_x, k_y)$ are collected as time-domain data. The data representing the spatial function $f(x, y)$ are corresponding to frequency-domain data, where each point of $f(x, y)$ is associated with certain magnetic resonance frequency. The data $g(x, k_y)$ can be considered as intermediate data with a first dimension in the frequency domain and a second dimension in the time domain.

In the above Equations 1–6, the units are chosen such that the intervals $\Delta k_x$, $\Delta k_y$, $\Delta x$, and $\Delta y$ correspond to a value of one. In this scale, the discrete values for $k_x$, $k_y$, x, and y become:

$$k_x=-n_x/2, -n_x/2+1, \ldots, -1, 0, 1, \ldots, n_x/2-2, n_x/2-1;$$

$$k_y=-n_y/2, -n_y/2+1, \ldots, -1, 0, 1, \ldots, n_y/2-2, n_y/2-1;$$

$$x=-n_x/2, -n_x/2+1, \ldots, -1, 0, 1, \ldots, n_x/2-2, n_x/2-1; \text{ and}$$

$$y=-n_y/2, -n_y/2+1, \ldots -1, 0, 1, \ldots, n_y/2-2, n_y/2-1.$$

Figure 2:
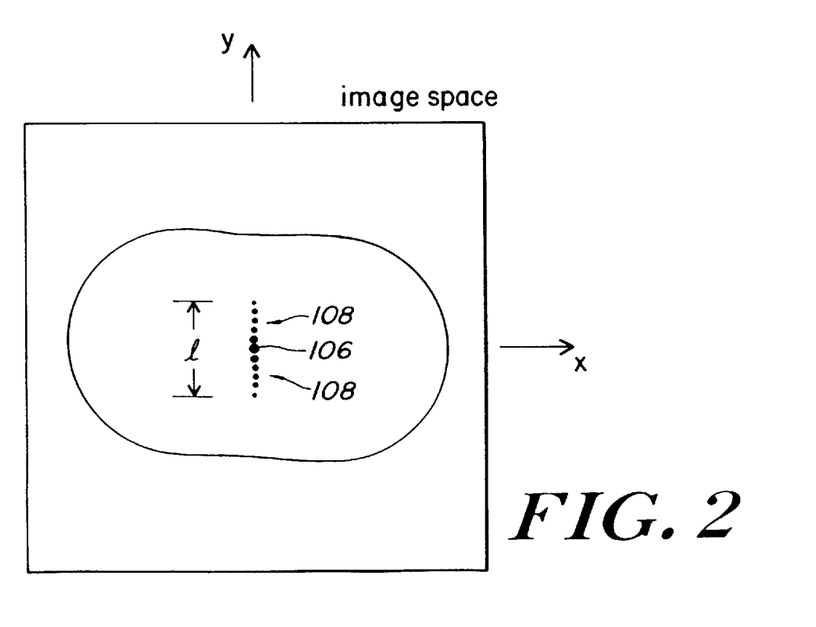
FIG. 2 is a plot in image space of an object image illustrating a line artifact generated as a result of DC offset drift in the collected data.

The receiver of a typical MRI scanner is optimized to detect minute MRI signals. In the presence of the RF transmitter, the hyper-sensitive RF receiver inevitably detects a finite, albeit small, level of stray transmitter signal referred to as a "feed-through" signal. This RF feed-through signal results in a corresponding DC offset in the collected base-band MRI signal. Unfortunately, at the receiver, this DC offset is indistinguishable from the true MRI signal emitted from the object at the center of the gradient field. As a consequence, a point artifact having a strong intensity level is generated at the center of the resulting image. The true image intensity at the center is thus completely obscured and inseparable from the point artifact. To complicate matters, the amount of RF feed-through does not necessarily remain constant during a scan. As a result, the DC offset may drift slightly from one phase-encoded signal to another. Consequently, the point artifact 106 spreads out along the direction of the y-axis and thus becomes a line artifact 108 peaking at the center 106 of image space as depicted in FIG. 2. The length l of the line artifact, in other words the number of image pixels affected by the DC offset, depends on the stability of the RF system. For a well-designed system, the length is limited to several pixels.

In addition to RF feed-through, the output of the RF mixer responsible for generating the base-band signal, as well as analog-to-digital converters in the receiver data channels, can also contribute to DC offset. DC offset levels generated by the mixer and the analog-to-digital converters are generally at a much lower magnitude than those of the RF feed-through. The amount of DC offset in each MRI signal is the combined result of these multiple sources.

Figure 3:
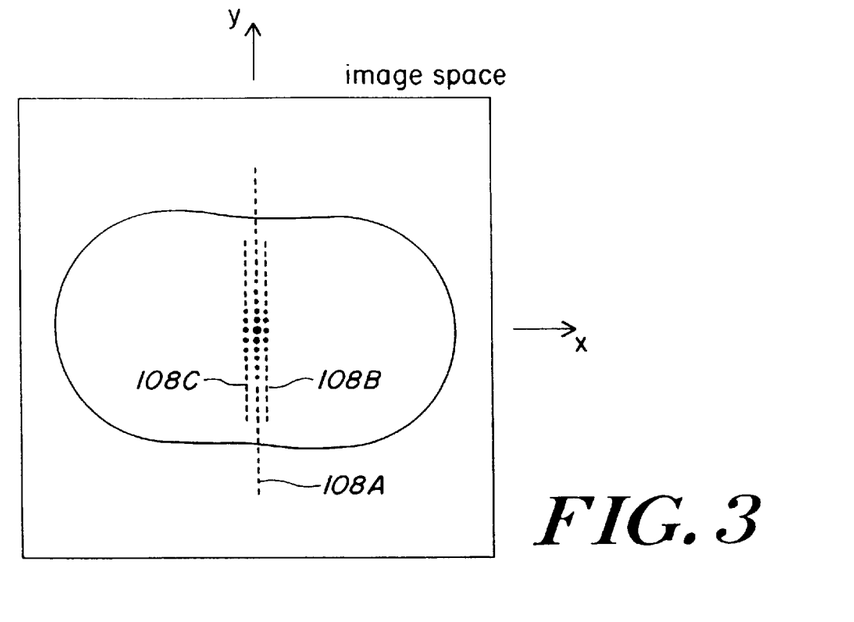
FIG. 3 is a plot in image space of an object image illustrating broadening of the line artifact in the readout direction and elongation of the artifact in the phase-encoding direction as a result of filtration.

The expanse and intensity of the point or line artifact are complicated by MRI signal processing. For practical reasons, the collected signal is commonly limited, for example truncated, to a finite sampling length. Such truncation introduces a ripple artifact on the image. In some scans, it is desirable to apply a technique referred to as a "windowing" function along the readout direction (x-axis) of k-space to reduce the truncation effect in that direction. Such a windowing function in k-space is equivalent to a low-pass filtration in image space. As result of this filtering, the line artifact 108 becomes broadened to include multiple lines 108A, 108B, 108C in the resulting image along the x-axis direction, as illustrated in FIG. 3.

It is often even more desirable to apply a second windowing function along the phase-encoding direction (y-axis) of k-space, since the truncation effect in that direction is usually more severe. As a result of this second windowing function along the y-axis, the line artifact 108A is elongated. Furthermore, to reduce scan time, it is common practice to replace collected data with null MRI signals at opposite ends of k-space along the phase-encoding direction, where the MRI signals are often diminished to very low amplitudes, in a process referred to as "zero filling". The truncation effect is worsened by the practice of zero filling, and, as a result, the length of the resulting line artifact 108A in image space is further extended.

The degree of DC offset due to RF feed-through can be somewhat mitigated through proper RF design, system construction and calibration. However, it is practically impossible to reduce the DC offset to a negligible level by these means. In one well-known approach for mitigating DC offset, the MRI signals are acquired twice, or four times, per phase encoding, with the RF pulses applied in alternating phases. The resulting MRI signals in each phase encoding are added and the DC offsets are substantially canceled. However, because the RF feed-through level is continuously drifting, the DC offset is not completely canceled, and the reminiscent artifact is still too large to ignore. Furthermore, this averaging technique can result in a prohibitively long scan time.

Another approach involves discarding the image data affected by the line artifact. For example, the image data along the center line of the image containing the line artifact 108A of FIGS. 2 and 3, are discarded and replaced by values interpolated from the pixels of adjacent lines. Although the interpolation technique is relatively simple and results in a final image that is artifact-free, removal of the artifact in this manner carries with it a setback. Firstly, the artifact occurs in the central region of the image, which is often the region of greatest interest to the observer. The interpolation thus reduces the resolution of the section of pixels superimposed with the artifact at the most interesting region of the image. Secondly, if the phase-encoding, windowing, and/or zero filling techniques are employed by the system, the resulting line artifact 108A is extended as shown in FIG. 3, and thus, virtually the entire set of pixels comprising the central line of the image along the y-axis are interpolated. More seriously, if a windowing function along the readout direction, or x-direction in k-space, is employed, then multiple lines of pixels 108B, 108C are affected by the interpolation, further reducing system resolution.

SUMMARY OF THE INVENTION

The present invention is directed to an apparatus and method for correction of DC offset in magnetic resonance imaging signals in a manner that overcomes the limitations of prior art techniques.

In a first aspect, the present invention is directed to a phase-alternated RF pulse sequence that causes the resulting DC offset artifact to be positioned at the edges of the object image, rather than at its center. Such placement of the artifact is tolerable in many applications, as it has little or no effect on the quality of data near the center of the image, at the most interesting portion of the object.

A preferred embodiment of the first aspect comprises a method for mitigating artifacts in an image of an object arising from DC offsets in a magnetic resonance imaging (MRI) scanner. The object is excited with RF pulses of substantially opposite phase to generate first and second sets of phase-encoded signals of substantially opposite polarity, comprising a signal component and a DC offset component. The first and second sets of phase-encoded signals are collected in a substantially interleaved order of phase encoding, and the polarity of at least one of the first and second sets is reversed. In this manner, the signal components of the first and second sets are of substantially the same polarity and the DC offset components of the first and second sets are of substantially opposite polarity. The first and second sets are then reconstructed to generate an image of the object.

In a preferred embodiment, the reconstructed object image includes a DC offset-derived artifact that is divided and located at opposite boundaries of the object image. The step of reconstructing preferably comprises the application of a Fourier transform.

In a second aspect, the present invention is directed to a method and apparatus for correcting DC offset by pre-calculating or estimating the offset from the collected data and using the estimated offset value to correct the collected data prior to image reconstruction. In this manner, the number of interpolated pixels are limited to a theoretical minimal level. This minimum number is unaffected by the windowing function in both readout and phase-encoding directions, or by the practice of zero filling. By combining the features of the second aspect with those of the first aspect, the interpolated pixels are located on the boundary region of the image, that is regions of minimal interest, rather than in the center of the image, as in conventional techniques, offering the advantages described above.

A preferred embodiment of the second aspect comprises a method for mitigating artifacts in an image of an object arising from DC offsets in a magnetic resonance imaging scanner. MRI signals generated by exciting the object with RF pulses are collected as MRI data. The MRI data are transformed to generate a selected portion of image data known to include spatial errors caused by DC offsets in the MRI data. Spatial errors resulting from the DC offsets are estimated in the selected portion of image data. The estimated spatial errors are inverse-Fourier transformed to generate estimated DC offsets. The collected MRI data are corrected by the estimated DC offsets to generate corrected MRI data. The corrected MRI data are reconstructed to generate image data substantially free of DC offset-derived artifacts.

An alternative embodiment of the second aspect comprises a method for mitigating artifacts in an image of an object arising from DC offsets in a magnetic resonance imaging scanner. MRI signals generated by exciting the object with RF pulses are collected as MRI data. The MRI data are transformed along a first dimension to generate intermediate data. The intermediate data are transformed along a second dimension to generate a selected portion of image data known to include spatial errors caused by DC offsets in the MRI data. Spatial errors resulting from the DC offsets are estimated in the selected portion of image data. The estimated spatial errors are inverse-Fourier transformed to generate estimated DC offsets for the intermediate data. The intermediate data are corrected by the estimated DC offsets to generate corrected intermediate data. The corrected intermediate data are reconstructed to generate image data substantially free of DC offset-derived artifacts.

The steps of transforming and inverse-transforming preferably comprise Fourier transforming and inverse-Fourier transforming. The step of estimating preferably comprises first computing the spatial distribution of the selected portion of image data along an image artifact line known to contain an artifact arising from the DC offsets. First and second adjacent spatial distributions of the selected portion of image data are computed on each side of the artifact line. Portions of the artifact line are interpolated based on the adjacent spatial distributions.

In a preferred embodiment, the step of interpolating comprises averaging the first and second adjacent spatial distributions to compute an averaged spatial distribution and subtracting the averaged spatial distribution from the image artifact line spatial distribution to provide a difference spatial distribution. A weighting function is preferably applied to the difference spatial distribution to interpolate regions of the artifact line containing the artifact and to retain the original image data in other regions of the artifact line. The weighting function is preferably determined as a function of the relative magnitudes of the averaged spatial distribution and the difference spatial distribution. A low-pass filtering function may be applied to the averaged spatial distribution and the difference spatial distribution.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

In the conventional technique described above of averaging phase-encoded signals from multiple signal acquisitions, the RF excitation pulse for a first signal acquisition is 180° out-of-phase with respect to the second acquisition. Consequently, the first and second collected MRI signals are of opposite polarity, while their DC offsets remain the same. By subtracting the second collected signal from the first collected signal, the resulting averaged MRI signal is doubled in magnitude and ideally free of DC offset. As described above, this technique is limited in performance due to RF feed-through drift and due to excessive processing time.

Figure 4:
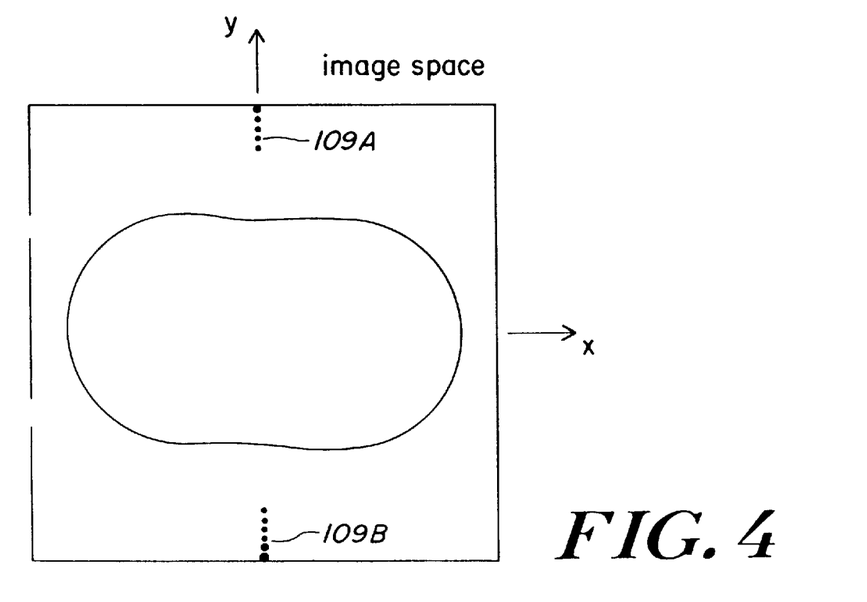
FIG. 4 is a plot in image space of an object image illustrating shifting of the artifact to the boundaries of the image by employing an alternating phase pulse sequence in accordance with the present invention.

In a first aspect of the present invention, phase-alternated RF excitation pulses are employed for excitation of successive phase-encoded MRI signals collected in a single acquisition. The collected MRI signals of alternate first and second phase encoding sets are therefore of opposite polarity. By reversing the sign of one of the first or second sets, all MRI signals are of the same polarity, while the DC offset components of those signals are of alternating polarities. Following this, the object image is reconstructed according to conventional techniques. However, as a result of the alternating polarities in the DC offset component of the signals, the artifact 109A, 109B, caused by the DC offsets is divided and shifted to opposite boundaries of the image as shown in FIG. 4. In this manner, the artifact does not interfere with the central regions of the image, which are usually the most interesting regions.

The present invention is further applicable to a process or system that employs the conventional technique of phase-alternated averaging. In this case, the phases of the RF pulses are alternated in multiple acquisitions of MRI signals in each step of phase encoding, and the MRI signals of the same phase-encoding step are averaged. In addition, the phases of RE pulses in each phase encoding step are further alternated with respect to the phase of the RF pulses in the adjacent phase encoding step. For example, if the RF pulses for the even number of phase encoding steps are applied in the phase sequence of 0° followed by 180°, the RF pulses for the odd number of phase encoding steps are then applied in the phase sequence of 180° followed by 0°. Thus, the averaged signals have opposite polarities between the even and odd number of phase encoding steps for image reconstruction. As in the phase-alternated scanning without averaging described above, the reminiscent artifact 109A, 109B is divided and shifted to the boundaries of the image along the central line, as in FIG. 4.

Under the phase-alternated scanning technique of the present invention, an alternating sign is applied to the calculations of Equations (2) and (3) so as to reverse the polarity of the alternate odd number sets of phase-encoded signals:

$$f(x, y) = \sum_{k_y=-n_y\Delta k_y/2}^{n_y\Delta k_y/2-\Delta k_y} \sum_{k_x=-n_x\Delta k_x/2}^{n_x\Delta k_x/2-\Delta k_x} (-1)^{k_y/\Delta k_y} \quad (7)$$
$$s(k_x, k_y)\exp\{-2\pi i(k_x x/n_x + k_y y/n_y)\} \quad \text{and}$$

$$g(x, k_y) = \sum_{k_x=-n_x\Delta k_x/2}^{n_x\Delta k_x/2-\Delta k_x} (-1)^{k_y/\Delta k_y} s(k_x, k_y)\exp\{-2\pi i(k_x x/n_x)\} \quad (8)$$

where $k_y/\Delta k_y$ is an integer ranging from $-n_y/2$ to $n_y/2-1$, and $(-1)^{k_y/\Delta k_y}$ alternates the polarity of the terms in the summation. The phase encoded signal $s(k_x, k_y)$ in the above Equations (6) and (7), may represent the original data collected by a single acquisition or, optionally, the data averaged from multiple acquisitions.

According to a second aspect, the present invention is directed to a method and apparatus for correcting DC offset by first pre-calculating, or estimating, the DC offset values from the collected data. Following this, the estimated offset values are applied to correct the collected data, and the corrected data are then used for image reconstruction.

Estimation of DC offset in each collected phase-encoded signal comprises several steps, discussed in detail as follows.

In a first step, a Fourier transform is preferably employed to compute the component of the image signal $g(0, k_y)$ along the central image line (e.g., along the phase-encoding axis (y-axis)) as well as the two adjacent collected signal components $g(-\Delta x, k_y)$ and $g(\Delta x, k_y)$ on either side of the central line. The complex signal component of the central line is then computed as:

$$g(0, k_y) = \sum_{k_x=-n_x\Delta k_x/2}^{n_x\Delta k_x/2-\Delta k_x} (-1)^{k_y/\Delta k_y} s(k_x, k_y) \quad (9)$$

The complex signal values of the adjacent lines are likewise computed as:

$$g(-\Delta x, k_y) = \sum_{k_x=-n_x\Delta k_x/2}^{n_x\Delta k_x/2-\Delta k_x} (-1)^{k_y/\Delta k_y} s(k_x, k_y)\exp\{2\pi i(k_x\Delta x/n_x)\}; \quad (10)$$

and $$g(\Delta x, k_y) = \sum_{k_x=-n_x\Delta k_x/2}^{n_x\Delta k_x/2-\Delta k_x} (-1)^{k_y/\Delta k_y} s(k_x, k_y)\exp\{-2\pi i(k_x\Delta x/n_x)\}; \quad (11)$$

where $n_x$ is the number of complex data points in each phase-encoded signal, which may comprise the originally-collected data from a single acquisition or, optionally, averaged data from multiple acquisitions.

When all data are collected, a Fourier transform is computed based on the components $g(0, k_y)$ calculated for all phase-encoded signals along the central line, to provide the spatial distribution $f(0, y)$ of the central line of the image as:

$$f(0, y) = \sum_{k_y=-n_y\Delta k_y/2}^{n_y\Delta k_y/2-\Delta k_y} g(0, k_y)\exp\{-2\pi i(k_y y/n_y)\} \quad (12)$$

with $$k_y=-n_y\Delta k_y/2, -n_y\Delta k_y/2+\Delta k_y, \ldots, -\Delta k_y, 0, \Delta k_y, \ldots, n_y\Delta k_y/2-2\Delta k_y, n_y\Delta k_y/2-\Delta k_y \quad (13)$$

Similarly, based on the results in Equations (10) and (11), the spatial distribution of the two lines $f(\pm\Delta x, y)$ adjacent to the central line are calculated:

$$f(-\Delta x, y) = \sum_{k_y=-n_y\Delta k_y/2}^{n_y\Delta k_y/2-\Delta k_y} g(-\Delta x, k_y)\exp\{2\pi i(k_y y/n_y)\}; \quad (14)$$

and $$f(\Delta x, y) = \sum_{k_y=-n_y\Delta k_y/2}^{n_y\Delta k_y/2-\Delta k_y} g(\Delta x, k_y)\exp\{-2\pi i(k_y y/n_y)\}. \quad (15)$$

The central line $f(0, y)$ given in Equation (12) contains the artifact arising from DC offset. As described above, image data can be interpolated for the central line from the adjacent computed lines $f(-\Delta x, y)$ and $f(\Delta x, y)$ as:

$$f_c(0, y)=0.5(f(-\Delta x, y)+f(\Delta x, y)). \quad (16)$$

Although such an interpolated central line $f_c(0, y)$ would be essentially free of artifacts arising from DC offset, the measured spatial data for regions of the central line not containing the artifact would be lost if the entire central line $f(0, y)$ were replaced by the interpolated central line $f_c(0, y)$.

A preferred embodiment of the present invention, rather than replacing the entire central line $f(0, y)$ by $f_c(0, y)$ through interpolation, replaces only those regions of the central line $f(0, y)$ contaminated by the DC offset artifact. As mentioned earlier, this region is limited to the two edges of the central line, assuming the phase-encoded signal technique described above is employed. Elsewhere, the actual data of the central line as measured $f(0, y)$ will be displayed in the reconstructed image.

It is preferable that the central line data are varied from measured data $f(0, y)$ to interpolated data $f_c(0, y)$ gradually over a transition region along the central line. A preferred technique to enable such a transitional correction first calculates the difference $d(0, y)$ in magnitude between the interpolated data and measured data along the central line as:

$$d(0, y)=f(0, y)-f_c(0, y). \quad (17)$$

Figure 5:
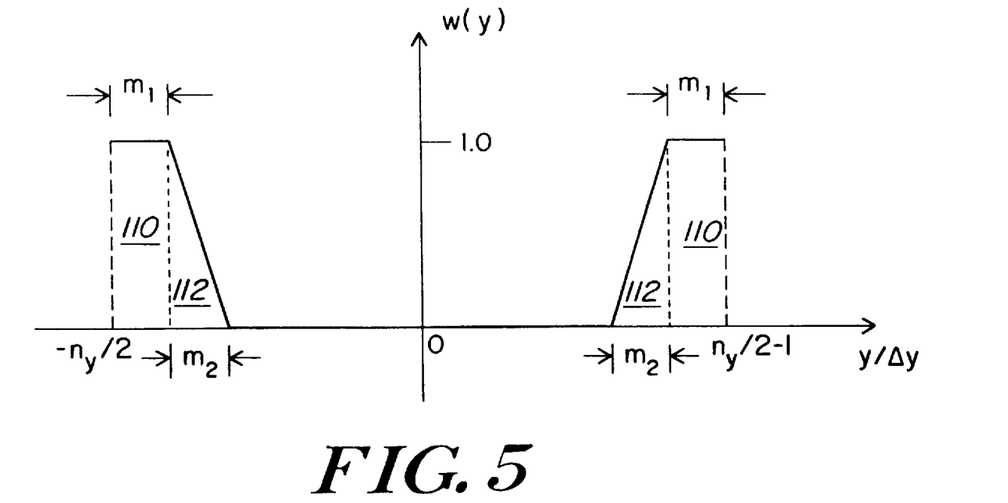
FIG. 5 is a plot of a weighting function w(y) for weighting the interpolation of the shifted line artifact at the boundaries of the image in accordance with the present invention.

A weighted difference $e(0, y)$ is then computed as:

$$e(0, y)=w(y)d(0, y), \quad (18)$$

where $w(y)$ represents a weighting function having a value of 1 in the DC offset artifact contaminated region 110 and gradually decreases to a value of 0 over the transition region 112, as illustrated in FIG. 5. Assuming there are $m_1$ data points along the central line in the contaminated region, and $m_2$ data points in the transition region, the weighting function can be written as:

$$w(y) = 1.0 \qquad\qquad\qquad\qquad \text{for } y/\Delta y = -n_y/2, -n_y/2+1, \ldots, -n_y/2+m_1 \qquad (19)$$
$$= 1.0 - (y/\Delta y + n_y/2 - m_1)/m_2 \qquad y/\Delta y = -n_y/2+(m_1+1), \ldots, -n_y/2+(m_1+m_2)$$
$$= 0.0 \qquad\qquad\qquad\qquad y/\Delta y = -n_y/2+(m_1+m_2+1), \ldots, n_y/2-(m_1+m_2+1)$$
$$= (y/\Delta y - n_y/2 + m_1 + m_2)/m_2 \qquad y/\Delta y = n_y/2-(m_1+m_2), \ldots, n_y/2-(m_1+1)$$
$$= 1.0 \qquad\qquad\qquad\qquad y/\Delta y = n_y/2 - m_1, \ldots, n_y/2-2, n_y/2-1$$

Assuming such a weighting function $w(y)$, the weighted difference $e(0, y)$ from Equation (18) represents the estimated error resulting from the DC offset over the entire measured central line. Based on this estimated error $e(0, y)$, the DC offset contained in each collected signal can be corrected before the image is reconstructed. The step of correction is described below, following a detailed discussion of the generation of the $m_1$ and $m_2$ values.

The length of the contaminated region m1 and the length of the transition region $m_2$ may comprise pre-selected constants. Since the actual length of the contaminated region may vary slightly for each scan, it may be desirable to determine these length values $m_1$, $m_2$ based on the data collected in each scan. A preferred method of determining $m_1$ compares the magnitude, or the square of the magnitude (for a simpler computation), of the difference values $d(0, y)$ from Equation (17), with the interpolated values $f_c(0, y)$ of the central line. That is, compare:

$$u(y)=d(0,y)d^*(0,y) \qquad (20)$$

with $$v(y)=f_c(0,y)f_c^*(0,y) \qquad (21)$$

Figure 6:
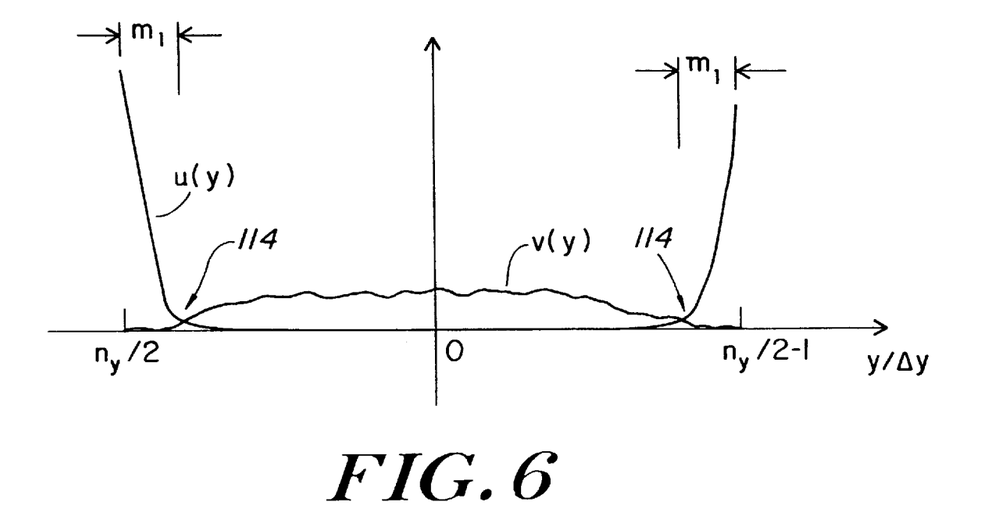
FIG. 6 is a plot of the behavior of the data u(y) and v(y), the square of the magnitude of the difference values d(0, y) and the interpolated values $f_c(0, y)$ of the central line respectively, in accordance with the present invention.

The value $u(y)$ peaks at the point along the central line having the highest DC offset contamination, in other words the position corresponding to $y/\Delta y$ at the boundary points of $-n_y/2$ and $n_y/2-1$, and declines toward the central position, $y=0$, as shown in FIG. 6. When the value $u(y)$ approaches the level of $v(y)$ at location 114, this is an indication of the boundary of the contamination region 110. The decline of value $u(y)$ toward value $v(y)$ is primarily a result of the slow variation property of the DC offsets in the collected signals, and not due to the signal component of the MRI signals emitted by the object.

A preferred embodiment applies a low pass filter to the values of $u(y)$ and $v(y)$ to minimize object-dependent variation. For example, filtered results may be computed as follows:

$$u(y)=0.2(u(y-2\Delta y)+u(y-\Delta y)+u(y)+u(y+\Delta y)+u(y+2\Delta y)) \qquad (22)$$

and $$v(y)=0.2(v(y-2\Delta y)+v(y-\Delta y)+v(y)+v(y+\Delta y)+v(y+2\Delta y)) \qquad (23)$$

When the position of $y_1$ is determined from the grouping of positions y along the y-axis, such that $u(y_1)<v(y_1)$, that position $y_1$ marks the boundary of the contaminated region. In alternative embodiments, instead of the five-point averaging as applied in Equation (23), a multiple point averaging may be employed, for example across the entire central line. Alternatively, a scaling factor may be applied to raise or lower the threshold level, or a pre-selected constant threshold may be employed. The length $m_1$ of the contaminated region can be set as the number of points between the image boundary and $y_1$ for each individual contaminated region, or alternatively may be set to the greater value of each contaminated region, or the average number of both contaminated regions. The length of the transition region $m_2$ can be predetermined, or alternatively determined from the data collected in each scan as a proportion of the value of $m_1$.

Correction of the collected data values using the estimated values will now be discussed.

The weighted difference function $e(0, y)$ from Equation (18) can be considered as the error component of the spatial distribution $f(x, y)$ along the central line $x=0$, as the result of a two-dimensional Fourier transform of the DC offset values. Like $f(0, y)$, the weighted difference $e(0, y)$ has $n_y$ complex points, although it is nonzero only in the regions near the two boundaries $y=-n_y\Delta y/2$ and $y=n_y\Delta y/2-\Delta y$. An inverse-Fourier transform is performed on the weighted difference function $e(0, y)$ along the y dimension to obtain the equivalent error component of $g(x, k_y)$ along the central line $x=0$ as:

$$g_e(0, k_y) = (1/n_y) \sum_{y=-n_y\Delta y/2}^{n_y\Delta y/2-\Delta y} e(0, y)\exp\{2\pi i(k_y y/n_y)\} \qquad (24)$$

Each point of the error component $g_e(0, k_y)$ can be considered as a one-dimensional Fourier transform of the DC offset contained in a phase encoded signal. Therefore, the DC offset in each phase-encoded signal $s(k_x, k_y)$, can be computed as the inverse-Fourier transform of the error component $g_e(0, k_y)$ in the x dimension:

$$s_e(k_x, k_y) = (1/n_x) \sum_{x=-n_x\Delta x/2}^{n_x\Delta x/2-\Delta x} g_e(0, k_y)\exp\{2\pi i(k_x x/n_x)\} \qquad (25)$$
$$= (1/n_x)g_e(0, k_y)$$

Note that the DC offset error values $s_e(k_x, k_y)$ calculated according to the above Equation (25) are independent of the readout direction $k_x$, as expected, and vary gradually with respect to the phase encoding direction $k_y$ as the result of drift in the DC offset during a scan.

Each of the originally-collected phase encoded signals $s(k_x, k_y)$ are next corrected by a corresponding calculated DC offset error value $s_e(k_x, k_y)$, to yield the corrected signal $s'(k_x, k_y)$ as:

$$s'(x, k_y) = \sum_{k_x=-n_x\Delta k_x/2}^{n_x\Delta k_x/2-\Delta k_x} (-1)^{k_y/\Delta k_y} s(k_x, k_y) - s_e(k_x, k_y) \qquad (26)$$

When the corrected signals $s'(k_x, k_y)$ are used to reconstruct the spatial distribution of the object $f(x, y)$, there will be no artifact induced by DC offsets in the central line of the image. Returning to Equations (1) and (2), two-dimensional Fourier transform reconstruction of the image can be computed as:

$$f(x, y) = \sum_{k_y=-n_y\Delta k_y/2}^{n_y\Delta k_y/2-\Delta k_y} \sum_{k_x=-n_x\Delta k_x/2}^{n_x\Delta k_x/2-\Delta k_x} s'(k_x, k_y)\exp\{-2\pi i(k_x x/n_x + k_y y/n_y)\} \qquad (27)$$

or as $$g(x, k_y) = \sum_{k_x=-n_x\Delta k_x/2}^{n_x\Delta k_x/2-\Delta k_x} s'(k_x, k_y)\exp\{-2\pi i(k_x x/n_x)\} \qquad (28)$$

followed by the calculation of Equation (3). In this manner, only the several points along the center line contaminated by DC offset are replaced, or interpolated, in the final image, instead of the whole central line as in the conventional techniques.

The following section describes techniques for streamlining the aforementioned calculations in special cases.

In the above process of estimation of the DC offset values followed by correction of the collected signals using the estimated values, the steps of estimation and correction are performed prior to reconstruction. This pre-calculation feature is necessary only when a windowing function $w_x(k_x)$ is applied along the readout direction (x-axis in k-space), wherein the first-dimension Fourier transform is computed by:

$$g(x, k_y) = \sum_{k_x=-n_x\Delta k_x/2}^{n_x\Delta k_x/2-\Delta k_x} s'(k_x, k_y)w_x(k_x)\exp\{-2\pi i(k_x x/n_x)\} \qquad (29)$$

rather than according to Equation (28).

Usually, the readout windowing function is not necessary, and the calculation of Equation (28) is used as the first-dimension Fourier transform of the reconstruction process. In this common situation, it is not necessary to pre-calculate the DC offset values. The first-dimension Fourier transform of the reconstruction can be performed in real-time as each phase-encoded signal is collected, as given by Equation (8). At the end of the scan, the complex signal values of the central line g(0, $k_y$) of Equation (9) and its two adjacent components g(–$\Delta x$, $k_y$) and g($\Delta x$, $k_y$) of Equations (10) and (11) are already included in the result of the computation of Equation (8). The repeated computations of Equations (9)–(11) can therefore be omitted.

When the remainder of the calculations, given by Equations (12)–(23), are used to determine the weighed difference function e(0, y), the equivalent error component of g(0, $k_y$) along the central line x=0 can be calculated as given in Equation (24). The values of $g_e(0, k_y)$ are then used to correct the errors contained in g(0, $k_y$) of Equation (8), wherein the errors resulted from DC offsets in the collected data, as:

g'(0, $k_y$)=g(0, $k_y$)–$g_e$(0, $k_y$) for x=0, and g'(x, $k_y$)=g(x, $k_y$) for x≠0 (30)

The corrected first-dimension Fourier transform results g'(x, $k_y$) are then used for the second-dimension Fourier Transform, as in Equation (3), $$f(x, y) = \sum_{k_y=-n_y\Delta k_y/2}^{n_y\Delta k_y/2-\Delta k_y} g'(x, k_y)w_y(k_y)\exp\{-2\pi i(k_y y/n_y)\} \qquad (31)$$

where a phase-encoding windowing function $w_y(k_y)$ is included to demonstrate the general case. The common practice of zero-filling described above may also be included in the calculation of Equation (31), in which the number of points in the y-dimension $n_y$ following zero-filling are greater than the actual number of the collected data points; in this case, values for g'(x, $k_y$) are set to zero for those extended points.

Note further that in this case, the computations of Equations (25) and (26) can likewise be omitted. It is therefore preferred to avoid the windowing function $w_x(k_x)$ along the readout direction in the reconstruction process, unless necessary. As described above, reconstruction without the readout windowing function $w_x(k_x)$ not only allows for real-time image reconstruction, but also greatly reduces the amount of computations required for the estimation and correction steps.

In the unlikely case where, not only is a readout window function $w_x(k_x)$ not employed, but neither are the phase-encoding window function $w_y(k_y)$ or zero filling, the computations can be further simplified. In this scenario, the estimation and correction steps can be performed following reconstruction of the spatial distribution f(x, y) according to Equation (7). The calculations for f(0, y), f(–$\Delta x$, y), and f($\Delta x$, y) in Equations (12)–(15) can be omitted, since they are available from the reconstructed spatial distribution f(x, y). Therefore, the weighted difference e(0, y) is calculated according to Equations (16)–(23), and the resulting correction is applied directly to the central line of the spatial distribution function f(x, y). That is, the values of the central line f(0, y) can be replaced by f(0, y)–e(0, y):

f(0, y)=f(0, y)–e(0, y). (32)

The corrected central-line f(x, y) is then used to calculate the magnitude of the object image, as given by Equation (6), free of the DC-offset artifact.

Figure 7:
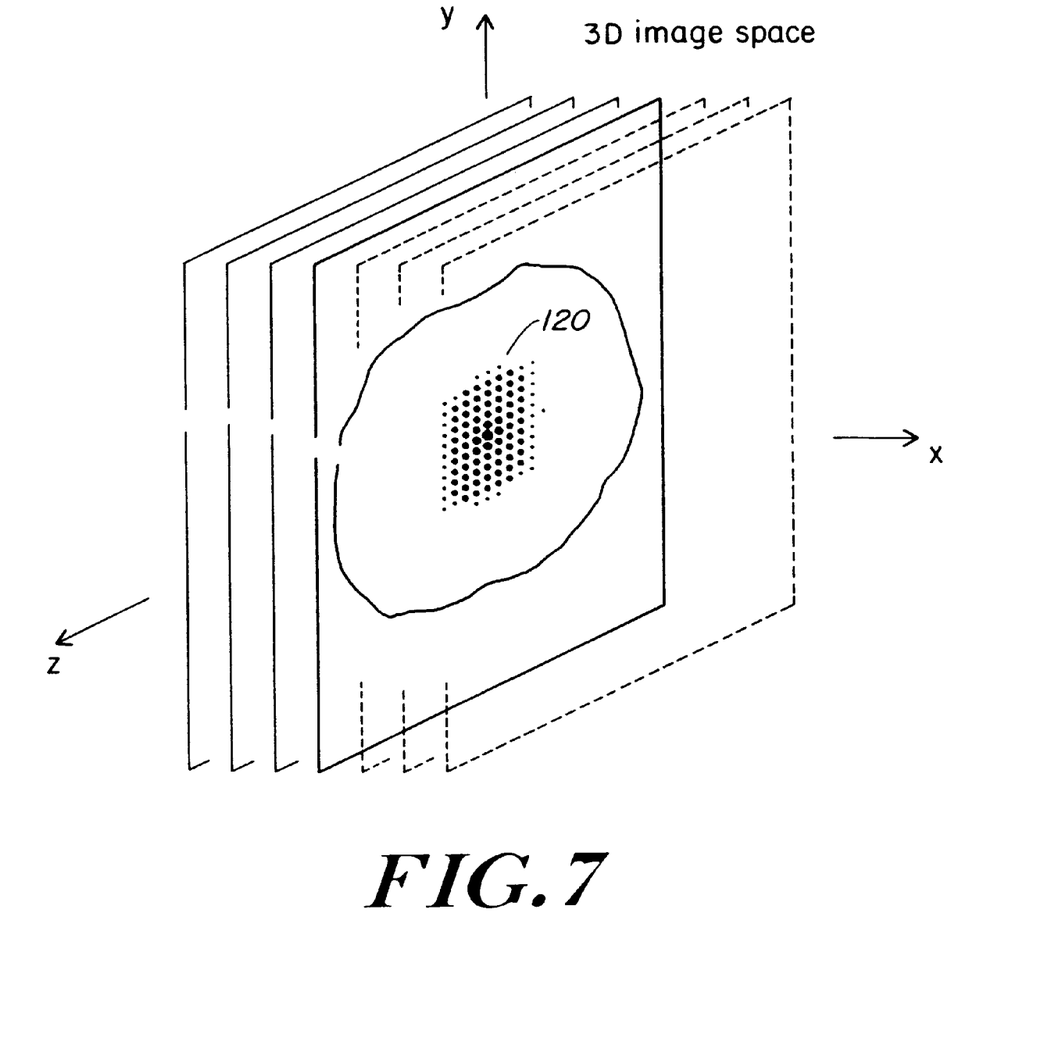
FIG. 7 is a plot in three-dimensional image space illustrating an artifact resulting from DC offset.
Figure 8:
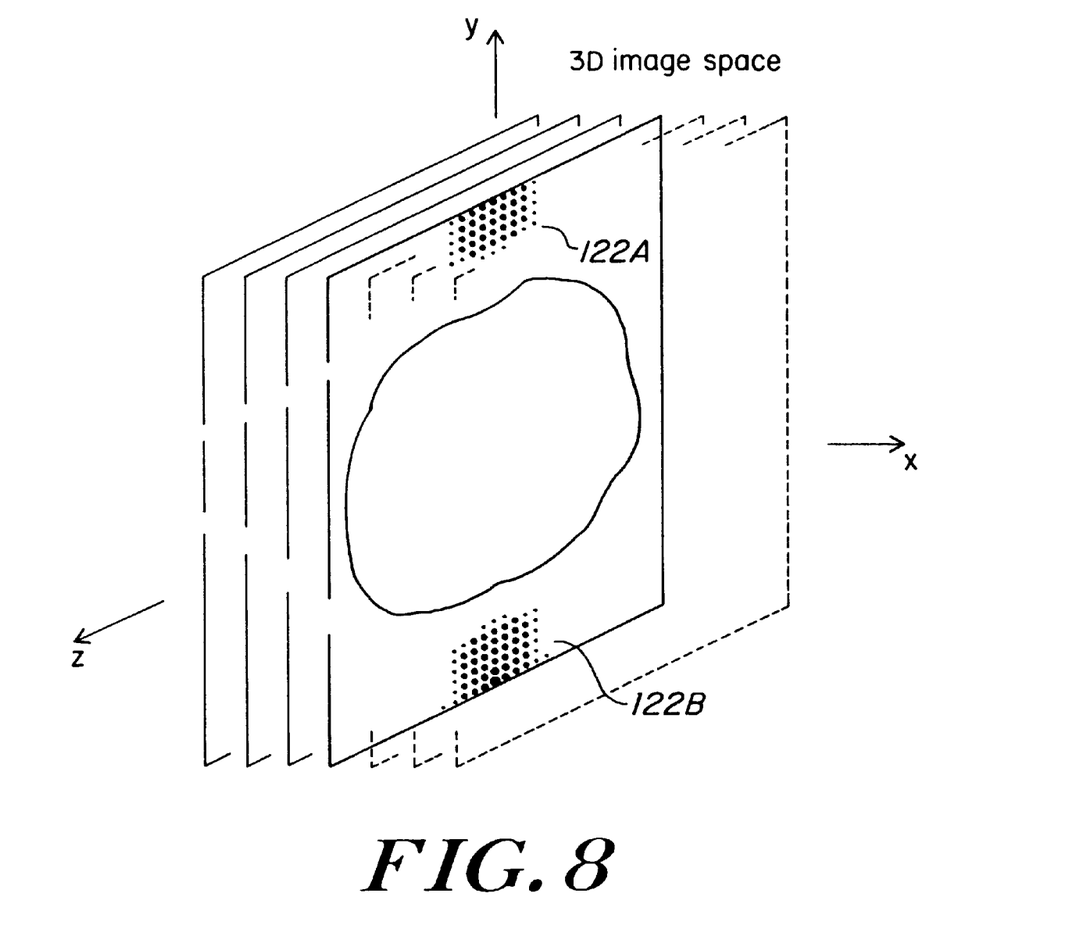
FIG. 8 is a plot in three-dimensional image space illustrating shifting of the artifact to the upper and lower boundaries of the image in accordance with the present invention.
Figure 9:
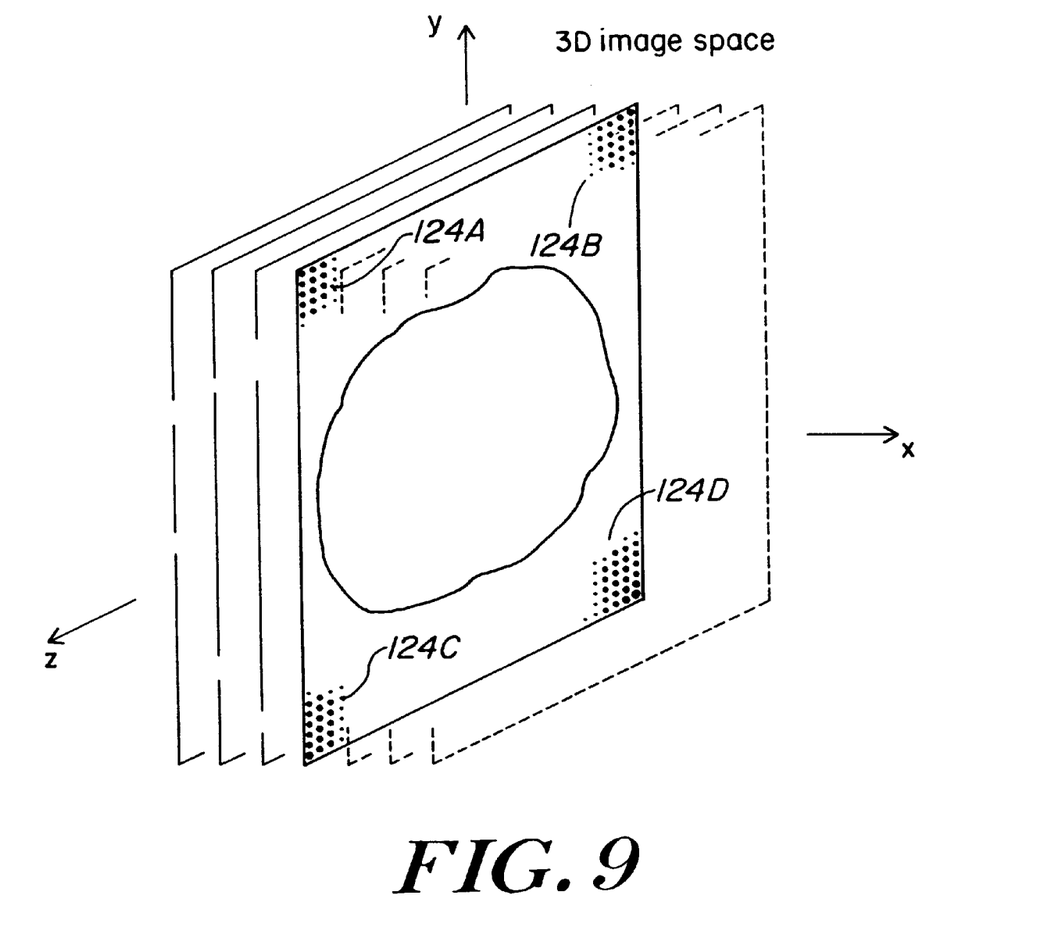
FIG. 9 is a plot in three-dimensional image space illustrating shifting of the artifact to the corner boundaries of the image in accordance with the present invention.

The processes of estimation and correction of the DC offsets described above are based on a two-dimensional scan sequence whereby each slice is reconstructed according to a two-dimensional Fourier transform. This method can be extended to a three-dimensional scan sequence whereby the entire volume of the object is reconstructed by three-dimensional Fourier transform. In a three-dimensional scan, phase encoding is required for both the y and z dimensions, and the DC-offset artifacts 120 appear on the central slice perpendicular to the x-axis as shown in FIG. 7. Phase-alternated RF pulse excitations in the phase-encoding dimension (y-axis) according to the inventive techniques described above divide and shift the artifact 122A, 122B to the boundaries of the image, along the phase-encoding dimension as illustrated in FIG. 8. Phase alternated RF excitations can be also used for phase-encoding along the z-dimension, in which case, the resulting DC-offset artifact 124A, 124B, 124C, 124D is split and shifted further to the corner boundaries of the image along the y-dimension and z-dimension as shown in FIG. 9. Phase-encoding along the z-dimension is not essential, since the artifact is already sufficiently shifted away from the central region by the phase alternated encoding in the y-dimension.

Two approaches for correction of artifacts arising from DC-offset in three-dimensional MRI imaging techniques are now described.

In the first approach, the three-dimensional scan sequence is treated as successive multiple two-dimensional scan sequences. The MRI signals collected at each z-dimension phase encoding are processed in the same manner as in the estimation and correction techniques described above. The third-dimension Fourier transform is performed after the DC offsets are subtracted from the collected data; that is subtracted from the one-dimensional Fourier transform result if the readout windowing function $w_x(k_x)$ is absent, or subtracted from the two-dimensional Fourier transform result if both the readout windowing function $w_x(k_x)$ and the phase-encoding windowing function $w_y(k_y)$ are absent and where zero-filling is not employed.

In the second approach, the DC offsets are estimated from the spatial distribution of the central slice f(0, y, z), and two adjacent slices f(-Δx, y, z) and f(Δx, y, z). As compared to the two-dimensional spatial distribution given by Equation (7), the three-dimensional spatial distribution is given by $$f(x, y, z) = \qquad (33)$$

$$\sum_{k_z=-n_z\Delta k_z/2}^{n_z\Delta k_z/2 - \Delta k_z} \sum_{k_y=-n_y\Delta k_y/2}^{n_y\Delta k_y/2 - \Delta k_y} \sum_{k_x=-n_x\Delta k_x/2}^{n_x\Delta k_x/2 - \Delta k_x} (-1)^{k_y/\Delta k_y}(\alpha)^{k_z/\Delta k_z} s(k_x, k_y, k_z)$$

$$\exp\{-2\pi i(k_x x/n_x + k_y y/n_y + k_z z/n_z)\}$$

where α is 1 or −1, depending on whether alternating phases are employed for encoding along the z-dimension. The spatial distribution of f(0, y, z), f(-Δx, y, z), and f(Δx, y, z), each at a constant x-location, are calculated in the same manner as described above with respect to Equations (12)–(15) for two-dimensional imaging. For three-dimensional imaging, Equations (16)–(18) become:

$$f_c(0, y, z) = 0.5(f(-\Delta x, y, z) + f(\Delta x, y, z)) \qquad (34)$$

$$d(0, y, z) = f(0, y, z) - f_c(0, y, z) \qquad (35)$$

$$e(0, y, z) = w(y, z)d(0, y, z) \qquad (36)$$

where w(y, z) represents a two-dimensional weighting function. The function w(y, z) may comprise a pre-selected table of values or may be calculated as multiple one-dimensional weighting functions, in the same manner as w(y) in Equation (19), for each z location within the contaminated and transition regions.

Likewise, Equations (20) and (21) become:

$$u(y,z) = d(0, y, z)d^*(0, y, z), \qquad (37)$$

and $$v(y,z) = f_c(0, y, z)f_c^*(0, y, z). \qquad (38)$$

Similar to the one-dimensional filtering performed in Equations (22) and (23), some form of two-dimensional low-pass filtering may be employed to generate u(y,z) and v(y,z) for better estimation of the DC offset values. As in the two-dimensional imaging techniques described above, the DC offset components are removed from the originally-collected signals or intermediate data in the three-dimensional reconstruction, depending on the presence of windowing functions and zero-filling processes.

In this manner, the present invention provides an effective and practical method and system for removing image artifacts resulting from DC offsets in the MRI signals while maintaining the integrity of the image in its central region, consisting of at least three techniques. The first technique employs a phase-alternating RF excitation pulse sequence, such that the relative phases of the successive phase-encoded signals alternate, for example between 0° and 180°, thereby dividing and repositioning the artifact from the center region of the image to the outer boundaries of the image. The second technique pre-calculates the spatial distribution function of the central line and its two adjacent lines before the completion of image reconstruction, and uses the spatial information from these three lines to estimate the spatial distribution resulting from the DC offset values. The third technique transforms the estimated errors in the spatial data resulting from DC offsets back to the time domain and subtracts these transformed values from the originally collected data. The third technique may also transform the estimated errors in the spatial data resulting from DC offsets back to the intermediate stage of reconstruction and subtracts these transformed values from the intermediate data.

The pre-calculation of the estimation allows for application of window functions and zero filling to the MRI signals for reconstruction without the limitations of conventional techniques. The computations required in this pre-calculation technique are insignificant relative to those required for image reconstruction.

For the sake of simplicity, the technique described above for estimation of the DC offset artifact is based on the linear interpolation of two lines adjacent to the central line as given by Equation (16). In alternative embodiments, additional adjacent lines can be employed for higher-order interpolation, at the expense of the additional computations required to calculate the spatial distribution of the additional lines prior to reconstruction.

The techniques of the present invention are especially attractive for acquisition without averaging of phase encoded signals; however, averaging of the phase encoding signals may also be employed to remove the reminiscent artifact. The present invention is applicable to both two-dimensional and three-dimensional scans, and in standard spin echo, inversion recovery, gradient echo sequences, and other imaging modes.

While this invention has been particularly shown and described with references to preferred embodiments thereof, it will be understood by those skilled in the art that various changes in form and in details may be made therein without departing from the spirit and scope of the invention as defined by the appended claims.

For example, in an application where phase-alternation is not employed, the resultant artifact is not shifted to the image boundary, but instead remains near its center. In this case, the weighting technique of the present invention may be employed for interpolating regions of the artifact near the center of the image, and for allowing outer regions to remain intact.

I claim:

1. A method for mitigating artifacts in an image of an object arising from DC offsets in a magnetic resonance imaging scanner comprising:

exciting the object with RF pulses of substantially opposite phase to generate first and second sets of phase-encoded signals of substantially opposite polarity, said phase-encoded signals comprising a signal component and a DC offset component;

collecting the first and second sets of phase-encoded signals;

reversing the polarity of at least one of said first and second sets of phase-encoded signals, such that the signal components of the first and second sets are of substantially the same polarity and such that the DC offset components of the first and second sets are of substantially opposite polarity; and reconstructing the first and second sets of phase-encoded signals to generate an image of the object.

2. The method of claim 1 wherein the image of the object includes a DC offset-derived artifact that is divided and located at opposite boundaries of the object image.

3. The method of claim 1 further comprising averaging the phase-encoded signals of each set.

4. The method of claim 1 wherein reconstructing comprises applying the first and second sets of phase-encoded signals to a Fourier transform.

5. The method of claim 1 wherein the collected sets of phase-encoded signals comprise MRI data and further comprising the steps of:

transforming the MRI data to generate a selected portion of image data known to include spatial errors caused by DC offsets in the MRI data;

estimating the spatial errors caused by the DC offsets in the selected portion of image data;

inverse-transforming the estimated spatial errors to generate estimated DC offsets;

correcting the collected MRI data by the estimated DC offsets to generate corrected MRI data; and reconstructing the corrected MRI data to generate image data substantially devoid of DC offset artifacts.

6. The method of claim 5 wherein estimating comprises:

computing the spatial distribution of the selected portion of image data along an image artifact line known to contain an artifact arising from the DC offsets;

computing first and second adjacent spatial distributions of the selected portion of image data on each side of the artifact line; and interpolating portions of the artifact line based on the adjacent spatial distributions.

7. The method of claim 6 wherein interpolating comprises:

averaging the first and second adjacent spatial distributions to compute an averaged spatial distribution;

subtracting the averaged spatial distribution from the image artifact line spatial distribution to provide a difference spatial distribution.

8. The method of claim 7 further comprising:

applying a weighting function to the difference spatial distribution to interpolate regions of the artifact line containing the artifact and to retain the original image data in other regions of the artifact line.

9. The method of claim 8 further comprising:

determining the weighting function as a function of the relative magnitudes of the averaged spatial distribution and the difference spatial distribution.

10. A method for mitigating artifacts in an image of an object arising from DC offsets in a magnetic resonance imaging (MRI) scanner comprising:

collecting MRI data generated by exciting the object with RF pulses;

transforming the MRI data to generate a selected portion of image data known to include spatial errors caused by DC offsets in the MRI data;

estimating the spatial errors caused by the DC offsets in the selected portion of image data;

inverse-transforming the estimated spatial errors to generate estimated DC offsets;

correcting the collected MRI data by the estimated DC offsets to generate corrected MRI data; and reconstructing the corrected MRI data to generate image data substantially devoid of DC offset artifacts.

11. The method of claim 10 wherein transforming comprises Fourier transforming and wherein inverse-transforming comprises inverse-Fourier transforming.

12. The method of claim 10 wherein estimating comprises:

computing the spatial distribution of the selected portion of image data along an image artifact line known to contain an artifact arising from the DC offsets;

computing first and second adjacent spatial distributions of the selected portion of image data on each side of the artifact line; and interpolating portions of the artifact line based on the adjacent spatial distributions.

13. The method of claim 12 wherein interpolating comprises:

averaging the first and second adjacent spatial distributions to compute an averaged spatial distribution;

subtracting the averaged spatial distribution from the image artifact line spatial distribution to provide a difference spatial distribution.

14. The method of claim 13 further comprising:

applying a weighting function to the difference spatial distribution to interpolate regions of the artifact line containing the artifact and to retain the original image data in other regions of the artifact line.

15. The method of claim 14 further comprising:

determining the weighting function as a function of the relative magnitudes of the averaged spatial distribution and the difference spatial distribution.

16. The method of claim 15 further comprising:

applying a low-pass filtering function to the averaged spatial distribution and the difference spatial distribution.

17. The method of claim 10 wherein correcting comprises subtracting the estimated DC offsets from the collected MRI data.

18. The method of claim 10 further comprising:

exciting the object with RF pulses of substantially opposite phase to generate first and second sets of phase-encoded signals of substantially opposite polarity, said phase-encoded signals comprising a signal component and a DC offset component;

collecting the first and second sets of phase-encoded signals; and reversing the polarity of least one of said first and second sets of phase-encoded signals, such that the signal components of the first and second sets are of substantially the same polarity and such that the DC offset components of the first and second sets are of substantially opposite polarity.

19. A method for mitigating artifacts in an image of an object arising from DC offsets in a magnetic resonance imaging (MRI) scanner comprising:

collecting MRI data generated by exciting the object with RF pulses;

transforming the MRI data along a first dimension to generate intermediate data;

transforming the intermediate data along a second dimension to generate selected portion of image data known to include spatial errors caused by DC offsets in the MRI data;

estimating the spatial errors caused by the DC offsets in the selected portion of image data;

inverse-transforming the estimated spatial errors to generate estimated DC offsets for the intermediate data;

correcting the intermediate data by the estimated DC offsets to generate corrected intermediate data; and reconstructing the corrected intermediate data to generate image data substantially devoid of DC offset artifacts.

20. The method of claim 19 wherein transforming comprises Fourier transforming and wherein inverse-transforming comprises inverse-Fourier transforming.

21. The method of claim 20 wherein estimating comprises:

computing the spatial distribution of the selected portion of image data along an image artifact line known to contain an artifact arising from the DC offsets;

computing first and second adjacent spatial distributions of the selected portion of image data on each side of the artifact line; and interpolating portions of the artifact line based on the adjacent spatial distributions.

22. The method of claim 21 wherein interpolating comprises:

averaging the first and second adjacent spatial distributions to compute an averaged spatial distribution;

subtracting the averaged spatial distribution from the image artifact line spatial distribution to provide a difference spatial distribution.

23. The method of claim 22 further comprising:

applying a weighting function to the difference spatial distribution to interpolate regions of the artifact line containing the artifact and to retain the original image data in other regions of the artifact line.

24. The method of claim 23 further comprising:

determining the weighting function as a function of the relative magnitudes of the averaged spatial distribution and the difference spatial distribution.

25. The method of claim 24 further comprising:

applying a low-pass filtering function to the averaged spatial distribution and the difference spatial distribution.

26. The method of claim 19 wherein correcting comprises subtracting the estimated DC offsets from the intermediate data.

27. The method of claim 19 further comprising:

exciting the object with RF pulses of substantially opposite phase to generate first and second sets of phase-encoded signals of substantially opposite polarity, said phase-encoded signals comprising a signal component and a DC offset component;

collecting the first and second sets of phase-encoded signals; and reversing the polarity of least one of said first and second sets of phase-encoded signals, such that the signal components of the first and second sets are of substantially the same polarity and such that the DC offset components of the first and second sets are of substantially opposite polarity.

* * * * *